United States Patent [19]

Comizzoli

[11] Patent Number: 4,580,156
[45] Date of Patent: Apr. 1, 1986

[54] STRUCTURED RESISTIVE FIELD SHIELDS FOR LOW-LEAKAGE HIGH VOLTAGE DEVICES

[75] Inventor: Robert B. Comizzoli, Montgomery Township, Somerset County, N.J.

[73] Assignee: AT&T Bell Laboratories, Murray Hill, N.J.

[21] Appl. No.: 567,370

[22] Filed: Dec. 30, 1983

[51] Int. Cl.⁴ .................. H01L 29/04; H01L 29/44
[52] U.S. Cl. .................................. 357/53; 357/59; 357/23.8
[58] Field of Search .............. 357/53, 59, 23 HV, 23.8

[56] References Cited

U.S. PATENT DOCUMENTS

| | | | |
|---|---|---|---|
| 3,491,273 | 1/1970 | Stiegler | 357/53 |
| 3,728,590 | 4/1973 | Kim et al. | 357/59 |
| 3,766,448 | 10/1973 | Luce et al. | 357/53 |
| 3,890,698 | 6/1975 | Clark | 357/53 |
| 3,906,539 | 9/1975 | Sauerman et al. | 357/53 |
| 3,911,473 | 10/1975 | Nienhuis | 357/53 |
| 4,009,483 | 2/1977 | Clark | 357/53 |
| 4,157,563 | 6/1979 | Bosselar | 357/53 |
| 4,297,149 | 10/1981 | Koons et al. | 357/59 |

FOREIGN PATENT DOCUMENTS 1251456  10/1971  United Kingdom ................ 357/53

Primary Examiner—William D. Larkins
Assistant Examiner—Charles S. Small, Jr.
Attorney, Agent, or Firm—David I. Caplan

[57] ABSTRACT

A segmented semi-insulating polysilicon (SIPOS) layer is used between conductors making contact to the surface of a silicon device in order to shield the surface from the effects of charge on dielectric layers above the surface so as to maintain breakdown voltages. The segmenting of the SIPOS layer significantly increases the resistance thereof and thereby limits leakage generated by the layer.

2 Claims, 2 Drawing Figures

STRUCTURED RESISTIVE FIELD SHIELDS FOR LOW-LEAKAGE HIGH VOLTAGE DEVICES

FIELD OF THE INVENTION

This invention relates to high voltage devices and, in particular, to high voltage semiconductor devices.

BACKGROUND OF THE INVENTION

The breakdown voltage of high voltage discrete devices and integrated circuits can be decreased by the presence of charge (usually ionic) on top surface insulator layers or within the insulating layers. Cracks or pinholes in an insulating layer can allow charge to leak up into or on top of the insulating layers and to spread out from the point of origination. If the potential generated by this leakage charge is different from that of the silicon below it, then field crowding results and breakdown voltages can be reduced. A technique for limiting this effect is to shield the silicon surface of the device from the effects of the charge on the insulator layer(s) by using a resistive field shield which contacts the surface of the device or is at some distance above the surface and makes electrical contact to conductors on the surface. A semi-insulating polysilicon (SIPOS) layer may be used as such a shield. One problem created by the use of a SIPOS shield layer is that it introduces leakage which may be greater than is acceptable in some applications.

It is desirable to maintain breakdown voltages of high voltage devices while maintaining any extra generated leakage at a relatively low level.

SUMMARY OF THE INVENTION

The present invention is directed essentially to the use of a segmented high resistive layer sandwiched between dielectric layers of a high voltage integrated circuit or discrete device and coupled to electrodes that are coupled to regions of the silicon below. The segmented resistive layer acts to shield the silicon below from the effects of charge which may accumulate on the upper dielectric layer and could, without the presence of a resistive layer, cause breakdown voltages to be lowered on or in the silicon below. The segmenting of the high resistance layer results in substantially higher resistance between the contacted electrodes than a complete sheet type layer and therefore introduces relatively little additional leakage between electrodes.

Viewed from a different aspect, the present invention is directed to a semiconductor structure with a semiconductor body having a major surface and a bulk portion of a first conductivity type. A first localized semiconductor region of the opposite conductivity type exists in the semiconductor body and has a portion thereof on the major surface. Electrodes are coupled to portions of the major surface. A resistive layer exists above the semiconductor body and is coupled to the electrodes. The invention is characterized by the resistive layer being sandwiched between the first and second dielectric layers and being segmented such that portions thereof define openings and/or windows therein. The size and geometry of the openings and/or windows in the resistive layer are selected such that electric fields generated in the surrounding and/or nearby portions of the resistive layer extend essentially wholly across the openings and/or windows and such that the resistance between electrodes through the resistive layer is relatively high compared to the resistance of a solid layer.

These and other novel features of the invention are better understood from consideration of the following detailed description taken in conjunction with the following drawings.

DETAILED DESCRIPTION

Figure 1:
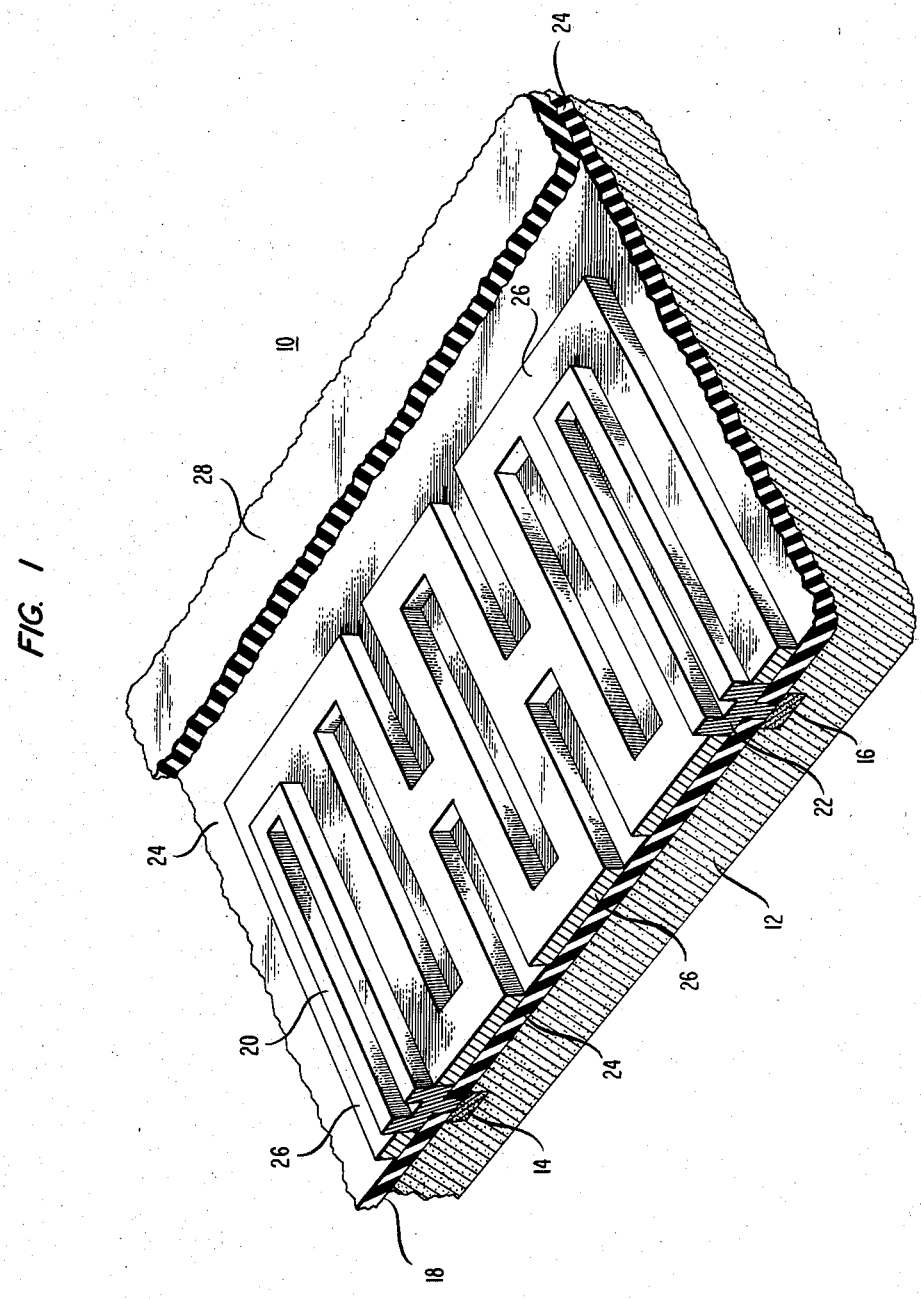
FIG. 1 illustrates a structure in accordance with one embodiment of the present invention.

Referring now to FIG. 1, there is illustrated a cross-sectional perspective view of a semiconductor structure 10 in accordance with the present invention. Structure 10 includes a semiconductor substrate 12 of a first conductivity type and having a major surface 18. A localized semiconductor region 14 of the first conductivity type, but of higher impurity concentration than that of substrate 12, exists within a portion of substrate 12 and has a portion thereof which includes a part of surface 18. A localized semiconductor region 16 of the opposite conductivity type, and of higher impurity concentration than substrate 12, exists within a portion of substrate 12 and has a portion thereof which includes a part of surface 18. Electrodes 20 and 22 make contact with regions 14 and 16, respectively, along parts of surface 18. A dielectric layer 24 exists on top of surface 18. A segmented resistive layer 26 exists over layer 24 and contacts electrodes 20 and 22. A dielectric layer 28 covers resistive layer 26, exposed portions of layer 24, and portions of electrodes 20 and 22.

Layer 26 acts as a shield which limits charge which reaches layer 28 from essentially affecting the semiconductor substrate 12 or regions 14 and 16. Accordingly, layer 26 serves to limit charge on or in layer 28 from affecting the breakdown voltages in the silicon below. The segmenting of layer 26 serves to keep the resistances between electrodes coupled thereto, such as electrodes 20 and 22, very high and thus limits leakage between same through layer 26.

In one typical embodiment substrate 12 and regions 14 and 16 are of p, p+, and n+ type conductivity, respectively. With these given conductivities, structure 10 functions essentially as a p-i-n diode with electrodes 20 and 22 serving as the anode and cathode, respectively. Layer 24 is typically silicon dioxide and layer 28 is typically silicon dioxide or silicon nitride. Layer 26 is typically semi-insulating polysilicon (SIPOS) and electrodes 20 and 22 are aluminum. Charge may leak from anode electrode 20 onto layer 28 and then find its way over semiconductor junction 30 which exists at the interface of p type substrate 12 and n+ type cathode region 16. This charge above junction 30 can lower the breakdown potential of junction 30 and thus degrade the performance of structure 10.

Resistive layer 26 acts to isolate any charge in or on layer 28 from affecting any of the silicon below. The windows and/or openings in layer 28 are designed in geometry and size such that electric field created in the adjacent portions of layer 26 which defines the openings and/or windows essentially almost completely covers the openings and/or windows. Effectively the field of the ionic charge terminates essentially in the resistive layer and does not reach or affect the silicon below.

A solid layer of SIPOS having a length of 80 microns, a width of 290 microns, and a thickness of 0.5 microns and a resistivity of approximately $1 \times 10^7$ ohm-cm, has a resistance of approximately $5 \times 10^{10}$ ohms. If such a layer is patterned as is layer 26 of FIG. 1, and the widths of all sections are 6 microns and all openings and/or windows have a 6 micron width, then the resistance is approximately $3.5 \times 10^{13}$ ohms. This represents an increase in resistance of approximately 3 orders of magnitude. With 600 volts applied between electrodes 20 and 22, the leakage through SIPOS layer 26 is approximately $17 \times 10^{-12}$ amperes. If the widths of segments of the SIPOS layer 26 and all the widths of all windows and/or openings are decreased to 3 microns with all else being the same, the resistance increases to approximately $1.8 \times 10^{14}$ ohms.

Figure 2:
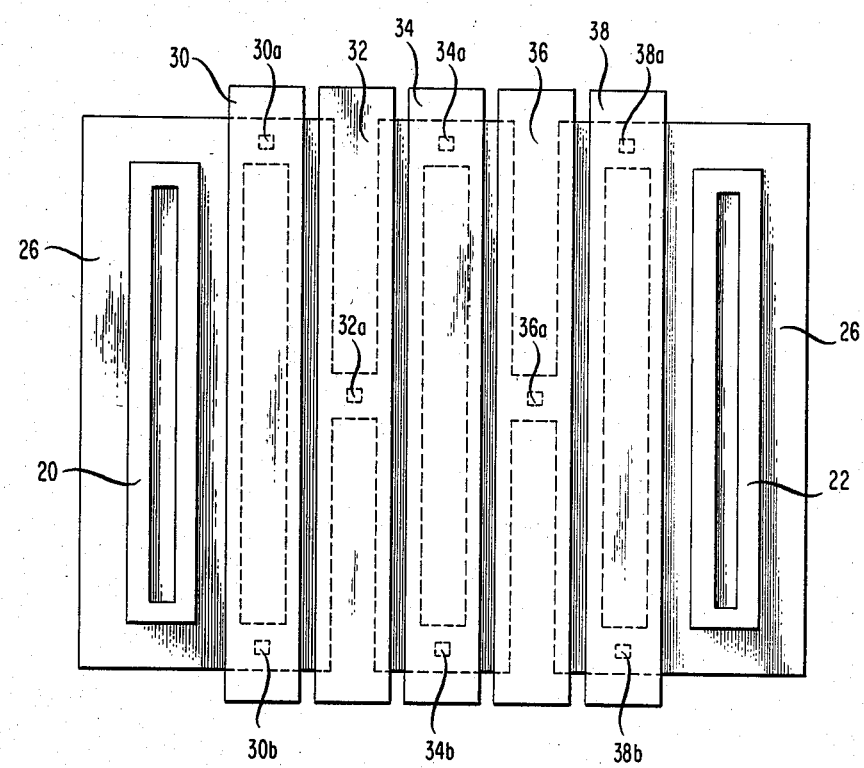
FIG. 2 illustrates a structure in accordance with another embodiment of the present invention.

FIG. 2 illustrates a partial top view of substrate 10 of FIG. 1 that shows electrodes 20 and 22 and layer 26. Optional separated conductors 30, 32, 34, 36, and 38 are also shown covering each opening or window in layer 26. These conductors are separated from layer 26 by an insulating layer 28 and are electrically connected to portions of layer 26 at various locations through openings (contact windows) 30a, 30b, 32a, 34a, 34b, 36a, 38a and 38b in layer 28 to conductors 30, 32, 34, 36, and 38 and various portions of layer 26. These conductors help better ensure that the electric fields due to ionic charges are terminated and do not reach the silicon. This provides additional protection against charge on or in layer 28 affecting the silicon below. These conductors are typically aluminum but can be polysilicon or other conductors.

Conductors 30, 32, 34, 36, and 38 are connected to layer 26 at such locations such that the resistance between electrodes 20 and 22 through layer 26 is only slightly lowered compared to the case where conductors 30, 32, 34, 36, and 38 are not used.

A computer analysis of the shielding capability of a solid SIPOS layer compared to a SIPOS layer containing openings and windows, as is illustrated in FIG. 1, showed that with the width of the openings and/or windows being approximately equal to the thickness of the dielectric layer below (i.e., layer 24), the shielding effect of the layer with openings and windows is approximately 75 percent as good as the solid layer. Wider openings and/or windows can be used provided that conductors, such as are illustrated covering the windows and/or openings in the SIPOS layer, are used.

The embodiments described herein are intended to be illustrative of the general principles of the invention. Various modifications are possible consistent with the spirit of the invention. For example, a dielectrically isolated gated diode switch or other silicon structure could be substituted for the p-i-n diode semiconductor structure. A segmented layer 26 still serves to protect breakdown voltages within the silicon below. Still further, the SIPOS could be replaced with other high resistance materials such as silicon enriched silicon nitride.

What is claimed is:

1. A semiconductor structure comprising a semiconductor body having a major surface and a bulk portion of a first conductivity type;

a resistive layer for limiting the potential buildup caused by electrical charge on a first dielectric layer;

the first dielectric layer being sandwiched between first portions of the major surface and the resistive layer;

a pair of localized semiconductor regions, at least one of which is of the conductivity type opposite the first, with a separate electrode coupled to each of said localized regions, and each of said localized regions having a portion thereof which forms a part of the major surface;

the resistive layer having a resistivity of at least the order of $10^7$ ohm-cm, the resistive layer being physically separated from the major surface by the thickness of the first dielectric layer, and the resistive layer being segmented such that portions thereof define openings and/or windows therein which do not contain a portion of the resistive layer;

the portions of the resistive layer which define the openings and/or windows being selected such that the size and geometry of the openings and/or windows are such the electric fields generated in these portions extend substantially across the openings and/or windows; and the size and geometry of the portions of the resistive layer being selected such that the resistance of the resistive layer between electrodes coupled thereto is increased due to the openings and/or windows by at least about three powers of ten;

the first dielectric layer having sufficient physical characteristics to essentially electrically isolate the resistive layer from the first portions of the major surface;

the resistive layer being semi-insulating polysilicon;

relatively low resistance conductors overlying the openings and/or windows in the resistive layer and being electrically coupled to localized portions of the resistive layer such that potentials of the conductors are close to potentials of the localized portions of the resistive layer that are coupled to the conductors; and the conductors being coupled to selected portions of the resistive layer such that the net resistance between electrodes through the resistive layer is reduced by a relatively insignificant amount as a result of the conductors.

2. The structure of claim 1 in which the conductors are made of aluminum or of doped polysilicon and in which the conductors are separated from the resistive layer by a second dielectric layer except at openings in the second dielectric layer through which the conductors are electrically coupled to the localized portions of the resistive layer.

* * * * *

UNITED STATES PATENT AND TRADEMARK OFFICE
CERTIFICATE OF CORRECTION

PATENT NO. : 4,580,156
DATED : April 1, 1986
INVENTOR(S) : Robert B. Comizzoli

It is certified that error appears in the above-identified patent and that said Letters Patent is hereby corrected as shown below:

Column 2, line 55, before "semiconductor" insert --the--.
after "junction" delete "30".

line 57, before "junction" insert --the--
after "junction" delete "30".

58, before "junction" insert --the--
after "junction" delete "30".

Column 4, line 33, before "electrodes" insert --the-- line 48, before "portions" delete "selected"
and insert --the localized--.

line 50, before "electrodes" insert --the--.

Signed and Sealed this

Eighth Day of November, 1988

Attest:

DONALD J. QUIGG

*Attesting Officer*   *Commissioner of Patents and Trademarks*